United States Patent [19]

Luich

[11] Patent Number: 5,089,721
[45] Date of Patent: Feb. 18, 1992

[54] GROUND BOUNCE ISOLATION AND HIGH SPEED OUTPUT CIRCUIT

[75] Inventor: Thomas M. Luich, Campbell, Calif.

[73] Assignee: National Semiconductor Corp., Santa Clara, Calif.

[21] Appl. No.: 512,786

[22] Filed: Apr. 20, 1990

[51] Int. Cl.$^5$ .................... H03K 19/003; H03K 17/16
[52] U.S. Cl. ................................ 307/443; 307/475; 307/542; 307/446
[58] Field of Search ............. 307/443, 542, 451, 362, 307/572, 475, 446

[56] References Cited

U.S. PATENT DOCUMENTS

| | | | |
|---|---|---|---|
| 4,609,834 | 9/1986 | Gal | 307/443 |
| 4,613,771 | 9/1986 | Gal | 307/443 |
| 4,862,018 | 8/1989 | Taylor et al. | 307/572 |
| 4,864,164 | 9/1989 | Ohshima et al. | 307/451 |
| 4,883,978 | 11/1989 | Ohshima et al. | 307/443 |
| 4,920,283 | 4/1990 | Elmer et al. | 307/443 |
| 4,975,603 | 12/1990 | Wise et al. | 307/443 |
| 4,988,895 | 1/1991 | Kihara et al. | 307/362 |

*Primary Examiner*—Stanley D. Miller
*Assistant Examiner*—Toan Tran
*Attorney, Agent, or Firm*—Steven F. Caserza; Michael Glenn

[57] ABSTRACT

An output buffer circuit advantageously uses a simple integrated circuit package including two separate ground leads for connection to an externally supplied ground voltage. The relatively large pull down current which passes through the pull down transistor of one or more output buffers are fed through a first ground lead of the lead frame to the external ground and the remaining circuitry is connected to the external ground through the second ground lead of the lead frame. The transients in the pull down current will cause ground bounce which affects the pull down transistor only, and not the remaining components of the output buffer. In this manner, base drive to the output pull down transistor is not decreased due to ground bounce, and the high to low transition of the output voltage is not degraded by the presence of ground bounce. In an alternative embodiment, the amount of ground bounce is controlled to provide a desired characteristic of the output transition.

13 Claims, 5 Drawing Sheets

GROUND BOUNCE ISOLATION AND HIGH SPEED OUTPUT CIRCUIT

BACKGROUND

This invention relates to integrated circuits and more particularly to output buffer stages and the fall time of such output stages when the output voltage switches from a high to a low voltage.

FIG. 1 is a diagram depicting a typical integrated circuit package 100 including an integrated circuit which has a plurality of output buffers 103-1 through 103-N. The ground lead of output buffers 103-1 through 103-N are connected to external ground 102 via a lead of package 100 which has associated therewith inductance 101. Each output buffer 103-1 through 103-N is connected to an associated load 112-1 through 112-N, respectively. When current is sunk from one or more loads 112-1 through 112-N, that current flows to ground 102 through inductance 101. If all output buffers 103-1 through 103-N are sinking a load current $I_{load}$ from loads 112-1 through 112-N, inductance 101 carriers a current $N(I_{load})$.

As is well known, inductance 101 causes ground bounce, i.e., an increase in the effective ground voltage above ground 102, when there is a change in the amount of current flowing through inductor 101. If for example output buffer 103-1 is sinking current from load 112-1 in a steady state condition, load 112-1 is held to a voltage substantially equal to the voltage of ground 102. If then one or more of the other output buffers switches in order to sink additional current through inductor 101, the "ground" voltage applied to load 112-1 will rise in voltage during the transient increase in current through inductor 101.

FIG. 2 is a schematic diagram of a typical prior art medium speed output buffer. An input signal is applied to node N21 in order to control output pull up transistor 233 and output pull down transistor 235 which in turn source and sink, respectively, current to load 212. With a logical one input signal applied to node N21, transistor 222 turns on, causing diode 224 to reverse bias, causing pull up resistor 225 to supply base drive to transistor 226. Transistor 226 thus turns on, thereby turning off transistor 229, and in turn turning on phase splitter transistor 232. With phase splitter transistor 232 turned on, pull up transistor 233 is turned off and pull down transistor is turned on, sinking current $I_{load}$ from load 212 through inductor 201 to ground 202. This causes the voltage applied to load 212 to switch from a high to a low voltage, as shown in FIG. 4. The delay between the time a high signal is applied to node N21 and the output voltage applied to load 212 goes low is caused by two mechanisms, the propagation delay through the circuitry between node N21 and output transistors 233 and 235, and the fall time caused by the presence of package inductance 201 which prevents the voltage applied to load 212 from falling to ground instantaneously.

Of importance, medium speed circuit 200 includes node N21 having a relatively large time constant, since capacitor 220 and pull up resistor 221 are relatively large. Circuit 200 also includes node N22 at the base of phase splitter transistor 232, which has a relatively small time constant, due to the rather small parasitic capacitance on node N22.

FIG. 3 is a circuit diagram of a typical prior art high speed output buffer. High speed output buffer 300 is similar to the medium speed output buffer 200 of FIG. 2 except that the inversions provided by transistors 226 and 229 of FIG. 2 are eliminated. This results in node N32 having a relatively large effective time constant, since node N32 follows node N31 through transistor 332 and diode 324. This has the effect of slowing the high to low transition of the output signal applied to load 312, while providing a low propagation delay.

Unfortunately, as current through inductor 301 changes, inductor 301 acts as a feedback impedance to the common emitter amplifier formed by transistors 332 and 335. Since node N32 has a large RC time constant, the voltage on node N32 acts as a small signal to the common emitter amplifier. The effect of the feedback impedance provided by inductor 301 reduces circuit gain and thus the output edge rate.

FIG. 5 is a diagram depicting the waveforms associates with high speed output buffer circuit 300 of FIG. 3, showing a smaller propagation delay than that of FIG. 4, but with an increased percentage of the total delay due to inductance effects.

FIG. 6 depicts a prior art integrated circuit lead frame 60 including two separate ground leads 61 and 62 for separate connections of grounds on an integrated circuit placed within cavity 64 of lead frame 60, for ultimate connection at pin 63 to a circuit ground. Such package has been used in the past in order to minimize ground noise problems.

FIG. 7 is a schematic diagram depicting a model of a typical prior art output circuit.

SUMMARY OF THE INVENTION

In accordance with the teachings of this invention, a novel output buffer circuit is taught which advantageously uses a simple integrated circuit package including two separate ground leads for connection to an externally supplied ground voltage. In accordance with the teachings of this invention, the relatively large pull down current which passes through the pull down transistor of one of more output buffers is fed through a first ground lead of the lead frame to the external ground and the remaining circuitry is connected to the external ground through the second ground lead of the lead frame. In this manner, the transients in the pull down current will cause ground bounce which affects the pull down transistor only, and not the remaining components of the output buffer. In this manner, base drive to the output pull down transistor is not decreased due to ground bounce, and the high to low transition of the output voltage is not degraded by the presence of ground bounce. In an alternative embodiment, the amount of ground bounce is controlled to provide a desired characteristic of the output transition.

DETAILED DESCRIPTION

Figure 6:
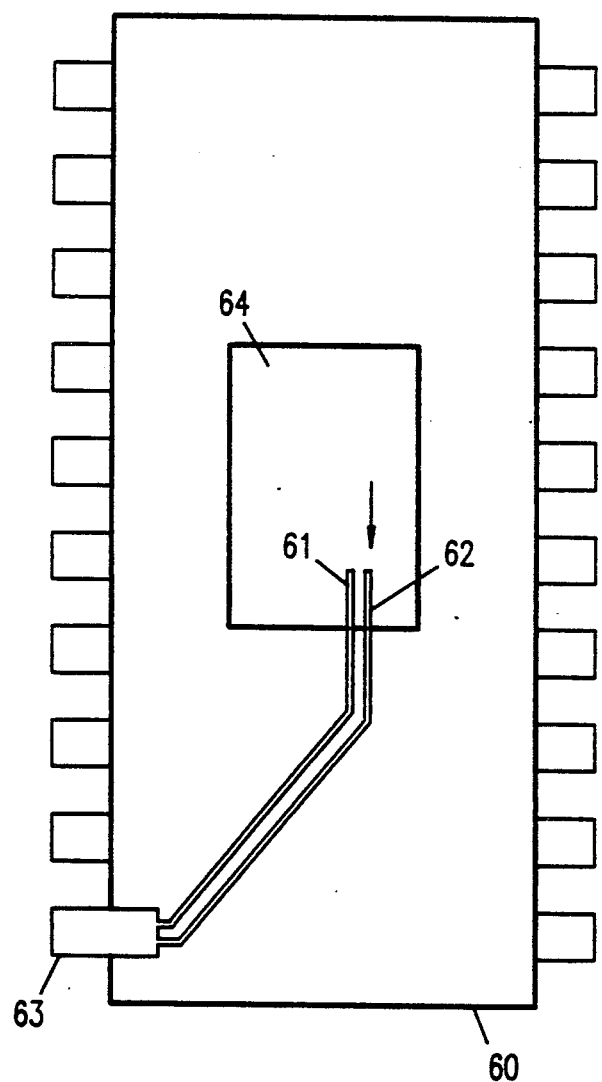
FIG. 6 depicts a prior art integrated circuit package including two separate ground leads connected to a single external ground pin.
Figure 8:
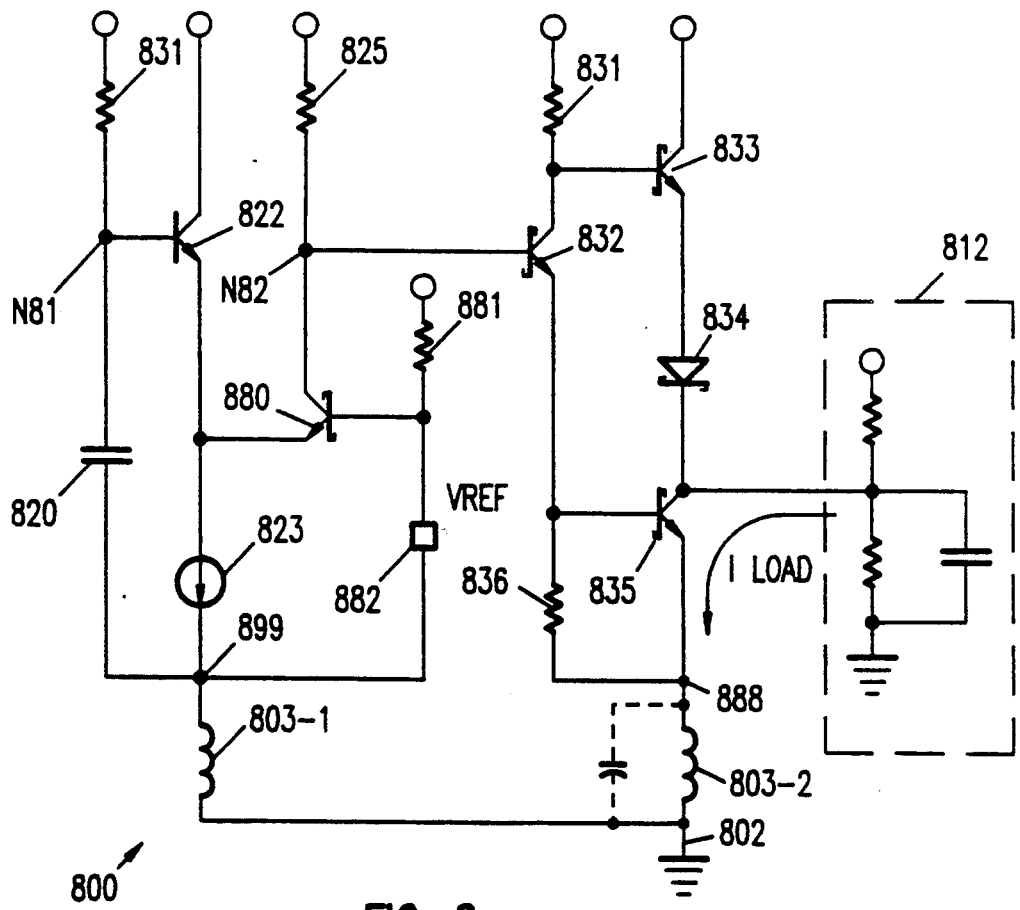
FIG. 8 is a schematic diagram depicting one embodiment of an output stage constructed in accordance with the teachings of this invention.

FIG. 8 is a schematic diagram of one embodiment of an output buffer constructed in accordance with the teachings of this invention. Output buffer 800 includes ground inductance 803-1, corresponding to lead 61 of the integrated circuit package shown in FIG. 6, for connecting external ground 802 to the driver circuitry of output buffer 800. Output buffer 800 also includes a second inductor 803-2 corresponding to lead 62 of the integrated circuit package shown in FIG. 6 for connecting output pull down transistor 835 to external ground 802. Reference supply 882 provides a bias voltage $V_{ref}$ to the base of transistor 880 which is connected in a common emitter configuration with transistor 822 to current source 823. With a high signal applied to input node N81, transistor 822 turns on, causing transistor 880 to turn off, raising node N82 high. This causes phase splitter transistor 832 to turn on, turning off output pull up transistor 833, and turning on output pulldown transistor 835. This causes pull down current $I_{load}$ to be sunk from load 812 through pull down transistor 835, through inductor 803-2, to ground 802. The ground bounce caused by inductor 803-2 is applied only to the emitter of output pull down transistor 835, and does not affect the components which are connected to ground through inductor 803-1 since there is no significant transient current through inductor 803-1 at this time.

Figure 1:
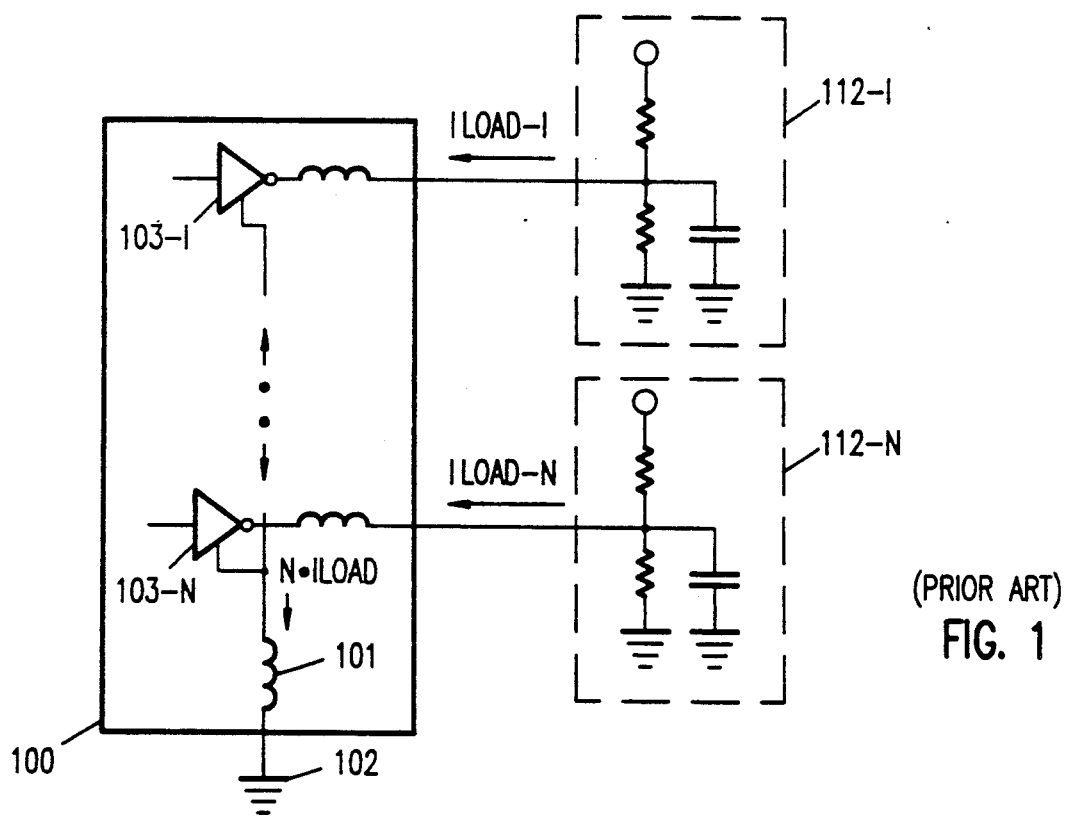
FIG. 1 is a diagram depicting a typical prior art output pull down structure.
Figure 4:
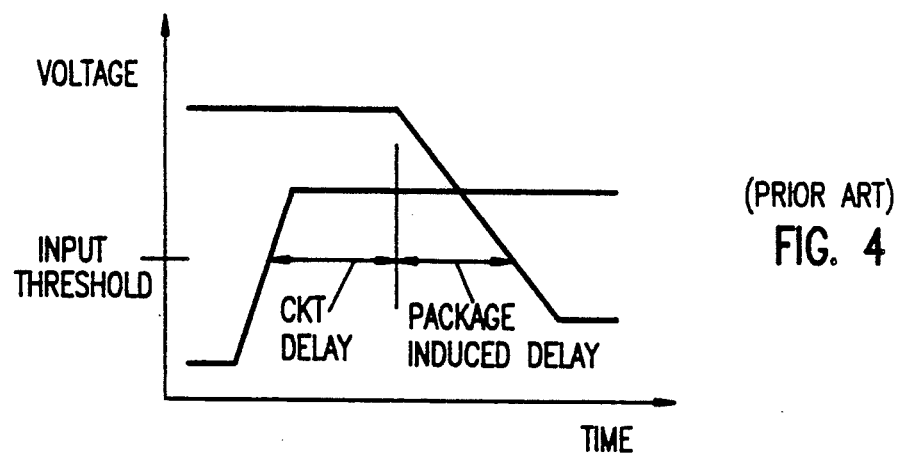
FIG. 4 is a waveform depicting the switching of the circuit of FIG. 3.
Figure 5:
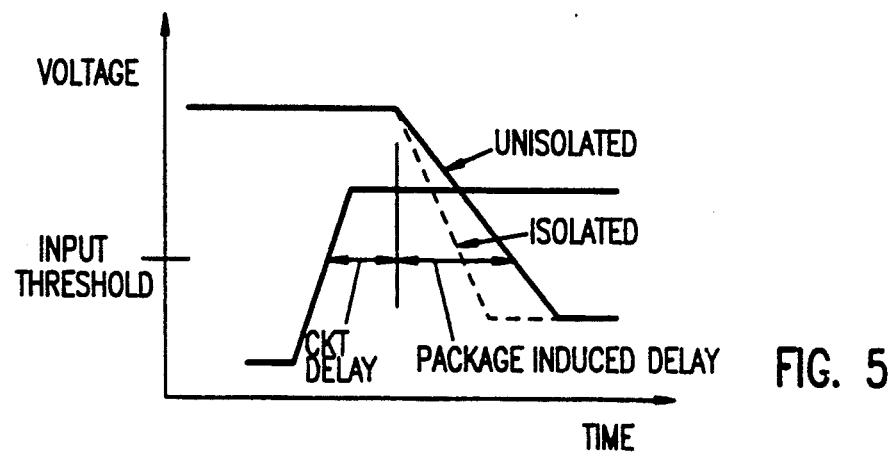
FIG. 5 is a wavefrom depicting the switching of the prior art circuit of FIG. 3 and the improvement in switching speed contained in accordance with the teaching of this invention.
Figure 2:
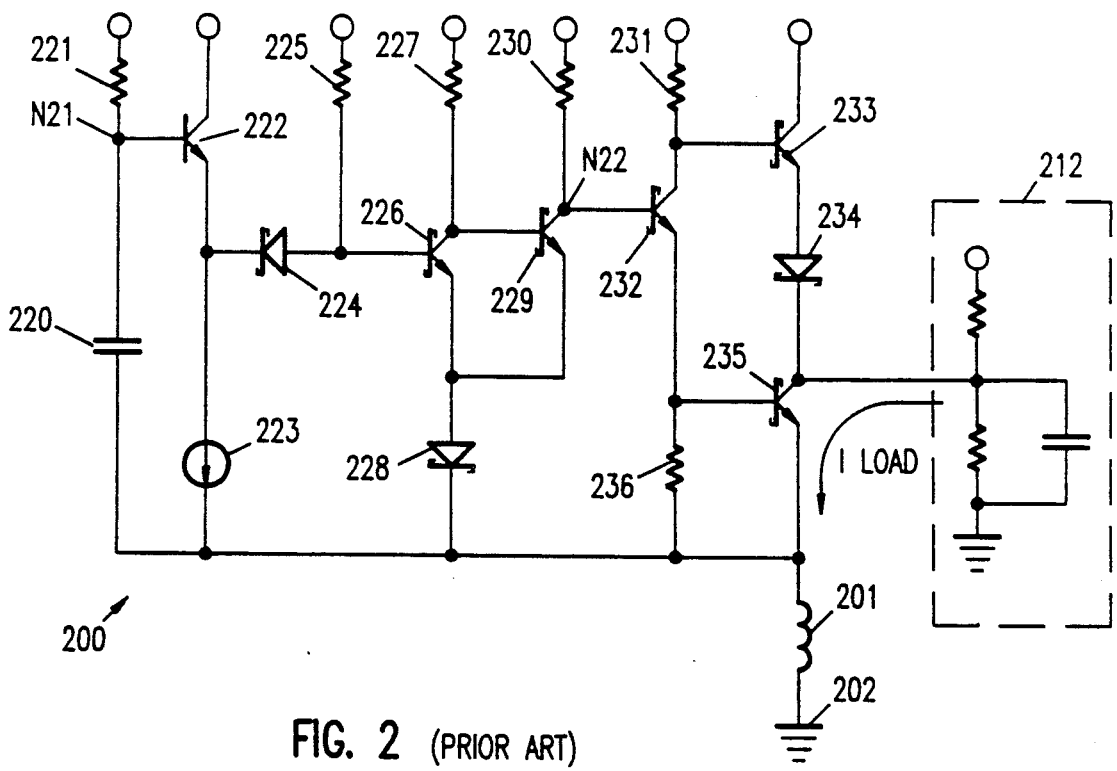
FIG. 2 is a medium speed output buffer circuit at the prior art.
Figure 3:
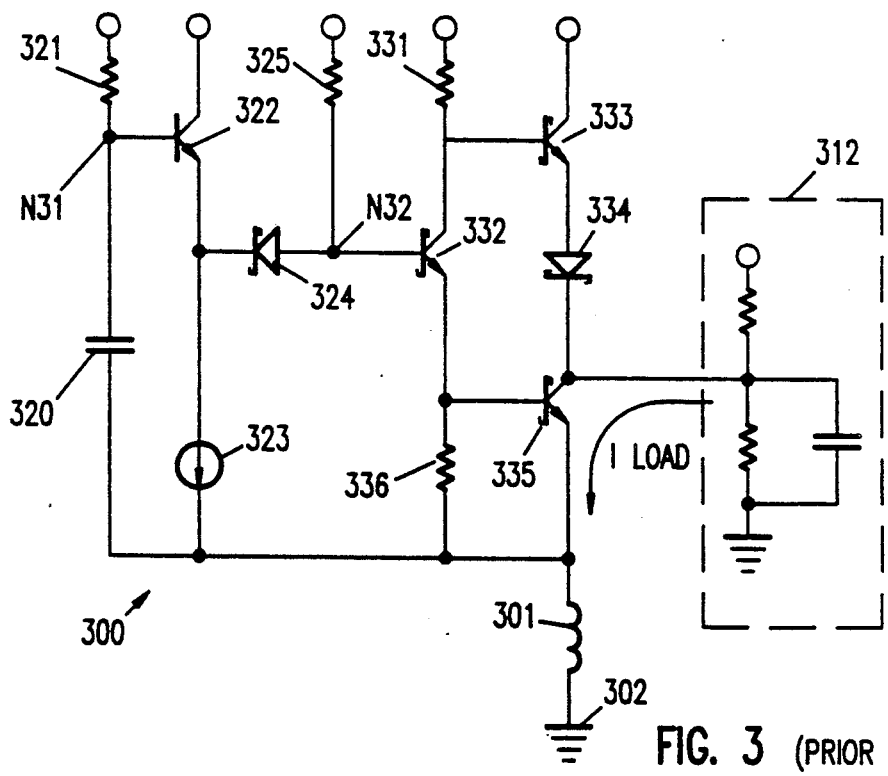
FIG. 3 is a high speed output circuit of the prior art.

In accordance with the teachings of this invention, a small time constant and therefore a fast input edge rate is provided at node N82 due to its low capacitance, thereby allowing the high to low transition of the output voltage to be very rapid, thereby enhancing switching speed. Furthermore, this small time constant is provided at node N82 without the need for additional inversions between nodes N81 and N82, as is the case with the prior art medium speed output buffer circuit of FIG. 2. Thus, without additional inversions between nodes N81 and N82, the propagation delay is reduced as compared with medium speed circuit 200 FIG. 2.

Figure 7:
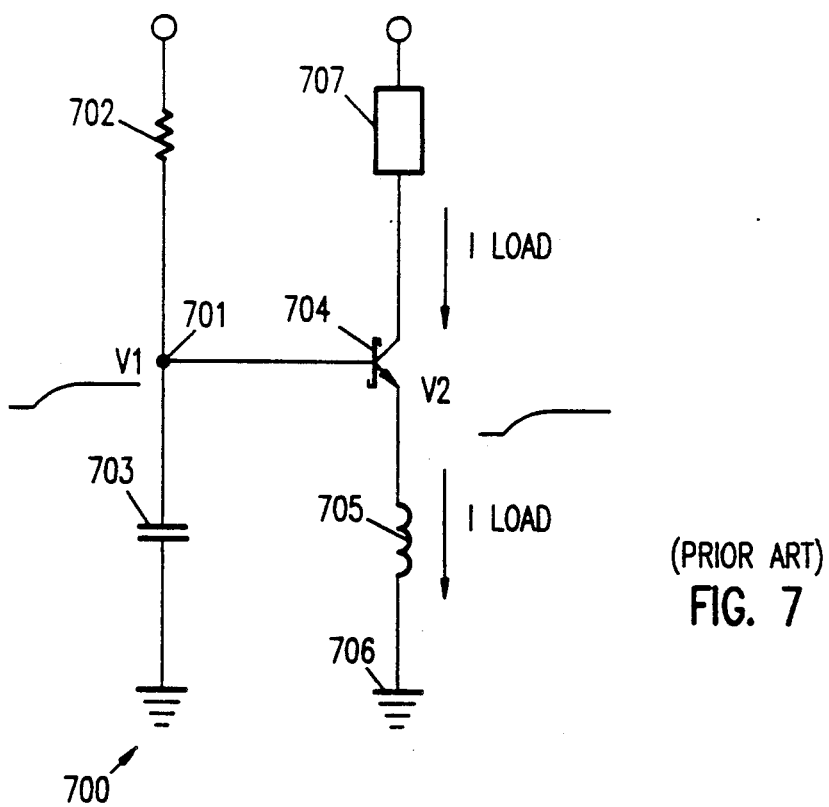
FIG. 7 is a schematic diagram depicting a model of a typical prior art output circuit.

The voltage relationships affecting the pull down output transistor are described now with reference to FIG. 7. FIG. 7 shows a portion of an output pull down transistor circuit 700 when pull down current $I_{load}$ is being conducted through pull down transistor 704 through package inductance 706 to ground 706.

$$V_2 = V_1 - V_{be};  \qquad (1)$$

where $V_1 =$ the voltage on the base of output pull down transistor 704;

$V_2 =$ the noisy ground voltage on the emitter of output pull down transistor 704; and $V_{be} =$ is the base-emitter voltage drop of output pull down transistor 704.

$$V_2 = L\, di/dt; \qquad (2)$$

where $L =$ the inductance of package inductance 705; and $I =$ the pull down current flowing through output pull down transistor 704.

Since $V_2$ cannot exceed $V_1-V_{be}$ when output pull down transistor 704 is turned on, small values of $V_1$ (or slow rise times) limit the magnitude of $V_2$, and therefore the magnitude of the change in current through package inductance 705, so $$V_1 = L\, dI/dt. \qquad (3)$$

For small $V_1$, L dI/dt is small, limiting the range of charge removal from the output load, and therefore limiting the output edge rate. Thus, for small swings of $V_1$ or slow low to high transitions of the input signal applied to node 701, voltage $V_1$ limits di/dt and therefore the speed of the high to low transition of the output voltage applied to load 707.

It is desirable to maximize $dV_{out}/dt$, where $V_{out}$ is the output voltage applied to load 707, in order to provide maximum output switching speed. For a capacitive load $$I = C \frac{dV_{out}}{dt}; \qquad (4)$$

where $C =$ the capacitance of the load.

$$V_2 = L\, C_{load} \frac{d^2 V_{out}}{dt} \qquad (5)$$

$$\frac{dV_{out}}{dt} = V_2 e^{(\frac{T}{LC_{load}})}$$

Therefore, in order to achieve large output edge rates (high $dV_{out}/dt$), the value of the noisy ground voltage $V_2$ must be high. from equation (6), $$\frac{dV_2}{dt} = LC_{load} \frac{d^3 V_{out}}{dt^3} \qquad (7)$$

Combining equations (6) and (2)

$$\frac{dV_1}{dt} = LC_{load} \frac{d^2}{dt^2}\left(\frac{dV_{out}}{dt}\right) \qquad (8)$$

thus $$\frac{dV_1}{dt} = \frac{dV_{out}}{dt} e^{(\frac{-T}{\sqrt{LC}})} \qquad (9)$$

Therefore, in order to increase the output transition speed, the input transition speed ($dV_1/dt$) must be increased.

Therefore, in order to maximize the high to low transition speed of the output signal, ground bounce should be maximized and the input edge rate should be maximized. Naturally, there are limits to the amount of ground bounce that a user of such a circuit can tolerate. However, in accordance with the teachings of this invention, ground bounce is desirably increased, in contrast to the thinking of the prior art in order to achieve a distinct advantage, i.e., a very rapid high to low transition of the output voltage applied to the load.

In an alternative embodiment of this invention, means is provided to control the voltage excursion on nodes N81 or N82, or means to control the rate at which the voltage are nodes N81 or N82. Such means include, for example, clamping the desired node to quiet ground 899, for example through one or more diodes or transistors. By preventing the voltage on node N82 from exceeding a predetermined level, the edge rate of the output signal is controlled inversely to the amount of ground bounce permitted on the output signal.

In another embodiment of this invention, output edge rate/ground bounce is controlled by adding a capacitance in parallel with ground inductance 803-2, preferably in an amount equal to the sum of the load capacitances connected to the plurality of output buffers contained on an integrated circuit. Naturally, such a technique is of most advantage when it is known what load capacitance is to be connected to each of the output terminals of the integrated circuit. However, even when this is not the case, for example when an integrated circuit is a relatively generic device that can be used in a number of systems having various load capacitances, an improvement can still be made by including a capacitance in parallel with ground inductance 803-2. In an alternative embodiment of this invention, a smaller value of capacitance is connected to the base of transistors 832 or 835 and reflected through transistor 832 to inductor 803-2, thereby providing an effective capacitance equal to the value of the capacitance multiplied by the beta of transistor 835.

Figure 9:
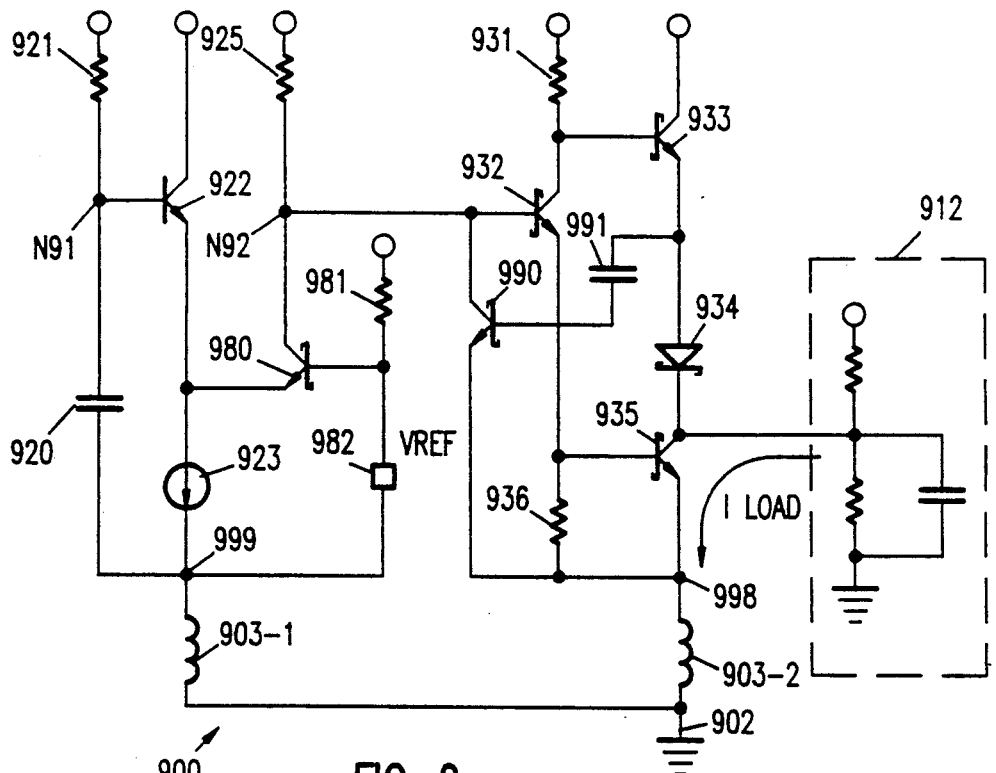
FIG. 9 is a schematic diagram of an alternative embodiment of an output circuit constructed in accordance with the teachings of this invention.

FIG. 9 is a schematic diagram of another embodiment of an output pull down circuit constructed in accordance with the teachings of this invention. Output pull down circuit 900 of FIG. 9 is similar to that of FIG. 8, but includes transistor 990 and capacitor 991 in order to provide a transient current between the base of transistor 932 and inductor 903-2. Circuit elements 990 and 991 serve to prevent phase splitter transistor 932 from turning on during a brief period of time during which the emitter voltage of output pull down transistor 935 falls below ground 902. This occurs due to changes in ground current through other output circuits contained on the same integrated circuit. Such below-ground emitter voltage would ordinarily cause phase splitter transistor 932 to turn on even with relatively low voltage applied to its base. With the inclusion of circuit elements 990 and 991, during this brief time period capacitor 991 supplies base drive to transistor 990 which turns on briefly in order to ensure that phase splitter transistor 932 remains turned off. Conversely, with the output voltage low, transistor 990 will not turn on even when noisy ground 998 changes voltage due to other output circuits switching current through package inductance 903-2.

While the embodiments of this invention depicted in FIGS. 8 and 9 include both output pull up and pull down transistors, it is readily understood by those of ordinary skill in the art in light of the teachings of this invention that this invention applies equally well to open collector output stages as well.

In an alternative embodiment of this invention, a means is provided to control the voltage excursion on node N92. By preventing the voltage on node N92 from exceeding a predetermined level, the edge rate of the output signal is controlled inversely to the amount of ground bounce permitted on the output signal.

In another embodiment of this invention, output edge rate/ground bounce is controlled by adding a capacitance in parallel with ground inductance 903-2, preferably in an amount equal to the sum of the load capacitances connected to the plurality of output buffers contained on an integrated circuit. In an alternative embodiment of this invention, a smaller value of capacitance is connected to the base of transistors 932 or 935 and beta multiplied.

Figure 10:
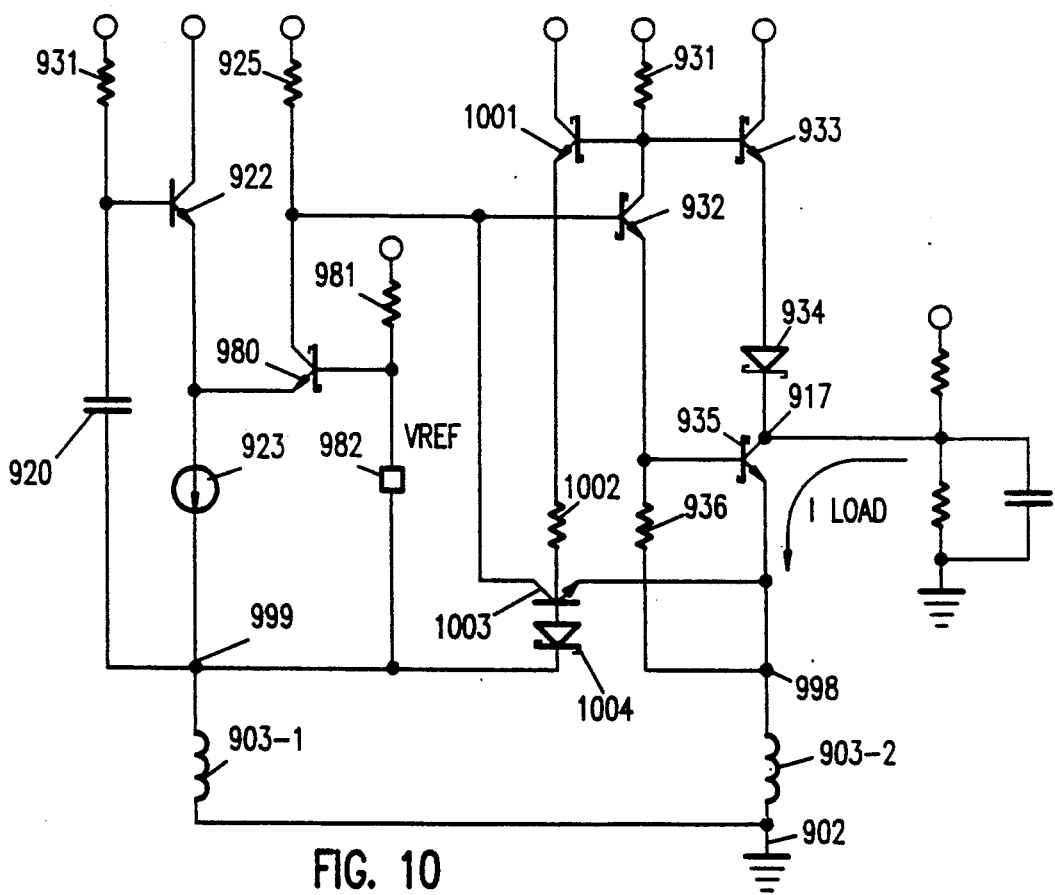
FIG. 10 is a schematic diagram of an alternative embodiment of an output circuit constructed in accordance with the teachings of this invention.

FIG. 10 is a schematic diagram of an alternative embodiment of this invention, which is similar to that shown in FIG. 9 and includes similar numbering. The embodiment of FIG. 10, however, includes transistors 1001 and 1003, resistor 1002, and diode 1004 in order to prevent transistor 932 from inadvertently turning on when output terminal 917 is high. This may occur when noisy ground voltage present on node 998 glitches low with respect to quiet ground voltage present on node 999, for example when current $I_{load}$ in this or other output stages on the same integrated circuit begin to conduct an increased amount of current. During this time, the noisy ground voltage on node 998 goes lower with respect to the quiet ground voltage on node 999, thereby increasing the voltage across the base-emitter junction of transistor 932. At this time, in accordance with the teachings of the embodiment of FIG. 10, transistor 1003 turns on due to its decreased emitter voltage, pulling down the base of transistor 932, preventing it from inadvertently turning on. Transistor 1001 and resistor 1002 provide base drive to transistor 1003, and diode 1004 clamps the base voltage of transistor 1003 to approximately 0.6 volts above the quiet ground voltage present on node 999.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An output circuit comprising:
    a first supply voltage lead for receiving an externally supplied first supply voltage;
    a second supply voltage lead for receiving an externally supplied second supply voltage;
    an input means for receiving an input signal, said input means having a relatively large time constant;
    an output terminal for providing an output signal in response to said input signal;
    an output pull down transistor having a first current lead coupled to said output terminal, a second current lead for coupling to said externally supplied second supply voltage via said second supply voltage lead, and a control lead;

driver means for providing a control signal to said control lead of said output pull down transistor in response to said input signal, said driver means including an input means having a relatively small time constant, said driver means being coupled to said first supply voltage and also being coupled to said externally supplied second supply voltage; and means for coupling said input means of said output circuit and said input means of said driver means comprising:
- a current source;
- a first transistor having an emitter coupled to said current source, a base coupled to said input means of said output circuit, and a collector coupled to said first supply voltage lead; and
- a second transistor having an emitter coupled to said current source, a base coupled to a bias voltage, and a collector coupled to said input means of said driver means.

2. A circuit as in claim 1 which further comprises:
- a third supply voltage lead for supplying said second supply voltage to said driver means;
- a first inductance coupled between said second supply voltage lead and said externally supplied second supply voltage; and
- a second inductance coupled between said third supply voltage lead and said externally supplied second supply voltage.

3. A circuit as in claim 2 wherein said first and second inductances are provided by a first and a second package lead of a leadframe for housing a semiconductor device.

4. A circuit as in claim 1 wherein said driver means comprises a control transistor having a first current terminal coupled to said first supply voltage, a second current terminal coupled to said control lead of said output pull down transistor, and a control lead coupled to said input lead of said driver means.

5. A circuit as in claim 4 which further comprises means for limiting the voltage on said control lead of said control transistor.

6. A circuit as in claim 1 which further comprises an output pull up transistor having a first current lead coupled to said output terminal, a second current lead coupled to said externally supplied first supply voltage via said first supply voltage lead, and a control lead, wherein said driver means also provides a control signal to said control lead of said output pull up transistor in response to said input signal.

7. A circuit as in claim 6 which further comprises:
- a third supply voltage lead for supplying said second supply voltage to said driver means;
- a first inductance coupled between said second supply voltage lead and said externally supplied second supply voltage; and
- a second inductance coupled between said third supply voltage lead and said externally supplied second supply voltage.

8. A circuit as in claim 7 wherein said first and second inductances are provided by a first and a second package lead of a leadframe for housing a semiconductor device.

9. A circuit as in claim 6 wherein said driver means comprises a control transistor having a first current terminal coupled to said first supply voltage, a second current terminal coupled to said control lead of said output pull down transistor, and a control lead coupled to said input lead of said driver means.

10. A circuit as in claim 9 which further comprises means for limiting the voltage on said control lead of said control transistor.

11. A circuit as in claim 2 which further comprises a capacitance coupled in parallel with said first inductance.

12. A circuit as in claim 11 wherein said capacitance is approximately equal to a load capacitance applied to said output terminal.

13. A circuit as in claim 11 wherein said capacitance comprises a beta multiplied capacitance.

* * * * *